United States Patent [19]
Gohara

[11] Patent Number: 6,140,806
[45] Date of Patent: Oct. 31, 2000

[54] POWER SUPPLY CONTROL UNIT AND POWER SUPPLY CONTROL METHOD

[75] Inventor: Takashi Gohara, Shizuoka-ken, Japan

[73] Assignee: Yazaki Corporation, Tokyo, Japan

[21] Appl. No.: 09/501,310

[22] Filed: Feb. 10, 2000

[30] Foreign Application Priority Data

| | | | |
|---|---|---|---|
| Feb. 12, 1999 | [JP] | Japan | P 11-35028 |
| Jan. 21, 2000 | [JP] | Japan | P 2000-13062 |

[51] Int. Cl.$^7$ ................................................ G05F 1/40
[52] U.S. Cl. ........................ 323/282; 323/283; 361/93.1
[58] Field of Search ................................. 323/265, 276, 323/282, 283, 349, 351; 361/93.1, 93.2, 93.9

[56] References Cited

U.S. PATENT DOCUMENTS

| | | | |
|---|---|---|---|
| 4,378,580 | 3/1983 | Stich | 361/91 |
| 4,685,040 | 8/1987 | Steigerwald et al. | 363/17 |
| 4,710,699 | 12/1987 | Miyamoto | 323/324 |
| 4,809,122 | 2/1989 | Fitzner | 361/18 |
| 4,933,798 | 6/1990 | Widmayer et al. | 361/18 |
| 5,144,155 | 9/1992 | Maenishi et al. | 327/487 |
| 6,005,303 | 2/1999 | Hawkes et al. | 307/44 |

*Primary Examiner*—Adolf Deneke Berhane
*Attorney, Agent, or Firm*—Finnegan, Henderson, Farabow, Garrett & Dunner, L.L.P.

[57] ABSTRACT

An abnormal current in a first semiconductor switch is detected. When an abnormal current occurs, ON/OFF of the first semiconductor switch is controlled so as to generate a vibration current. The first semiconductor switch is shut off by this vibration current. A voltage between drain and source of the first semiconductor switch is compared with a voltage between drain and source of a second semiconductor switch by means of a comparator. Then, a control voltage is supplied from a driving circuit to gate terminals of the first semiconductor switch and second semiconductor switch according to a result of this comparison.

6 Claims, 6 Drawing Sheets

POWER SUPPLY CONTROL UNIT AND POWER SUPPLY CONTROL METHOD

BACKGROUND OF THE INVENTION

1. Field of the Invention

The present invention relates to a power supply control unit and a power supply control method, and more particularly to a power supply control unit having a semiconductor switch for controlling power supply from a power source to a load by switching control depending on a control signal.

2. Description of the Related Art

FIG. 1 shows a conventional power supply control unit having a semiconductor switch. This conventional power supply control unit supplies a power from a battery to each load selectively and controls the power supply to the load.

In this conventional power supply control unit shown in the same Figure, a shunt resistor RS and a drain D-source S of a thermal FET QF are connected in series in a path for supplying an output voltage VB of a power source 101 to a load 102 like a fuel gauge provided in a fuel tank.

Further, this power supply control unit comprises a driver 901 for detecting a current flowing in the shunt resistor RS so as to control a driving of the thermal FET QF by a hardware circuit, an A/D converter 902 for carrying out ON/OFF control of a driving signal of the thermal FET QF based on a current value monitored by a driver 901, a microcomputer (CPU) 903 and a transistor Q920 for turning on a lamp 921 depending on a control signal from the microcomputer 903.

The thermal FET QF acting as a semiconductor switch contains an over-heat cut-off function for turning itself OFF by an incorporated gate shut-off circuit when an incorporated temperature sensor (not shown) detects that a temperature of the thermal FET QF rises up to a temperature above a predetermined one. A symbol RG in the same Figure indicates a resistor and ZD1 denotes a Zener diode which maintains 12 V between gate G and source S and bypasses when an overvoltage is about to be applied to the gate G.

Further, this conventional power supply control unit also includes a protective function for an overcurrent on the load 102 or between the drain D and source S of the thermal FET QF. Namely, the driver 901 comprises differential amplifiers 911, 913 as a current monitor circuit, a differential amplifier 912 as a current control circuit, a charge pump circuit 915 and a driving circuit 914 for driving the gate G of the thermal FET QF via an internal resistor RG based on an ON/OFF control signal from the microcomputer 903 and a result of overcurrent determination from a current control circuit.

When an overcurrent is detected via the differential amplifier 912 based on a voltage drop in the shunt resistor RS by determining that the current exceeds its predetermined (upper limit) value, the thermal FET QF is turned OFF by the driving circuit 914 and when the current drops below a predetermined (lower limit) value, the thermal FET QF is turned ON.

On the other hand, the microcomputer 903 always monitors a current via current monitor circuits (differential amplifiers 911, 913). When an abnormal current exceeding a normal value flows, it turns OFF the thermal FET QF by turning OFF a driving signal to the thermal FET QF. When the temperature of the thermal FET QF exceeds its predetermined value before the driving signal for OFF control is outputted from the microcomputer 903, the operation of the thermal FET QF is turned OFF by the overheat cut-off function.

The microcomputer 903 determines whether or not a current always monitored via the current monitor circuits (differential amplifiers 911, 913) becomes an abnormal current over its normal value. When such an abnormal current flows, the ON control signal is outputted to the transistor Q920 so as to switch the transistor Q920, thereby supplying power VB to a lamp 921. As a result, it can be notified to an operator, for example, that abnormal current flows to a fuel gauge in the fuel tank.

However, the above-mentioned conventional power supply control unit absolutely needs the shunt resistor RS which is connected directly to a power supply path in order to detect a current. Therefore, because in recent years, current flowing through a load increases enormously with a reduction of the ON resistance on the thermal FET QF, heat loss in the shunt resistor RS cannot be neglected. This is one of problems found in the conventional power supply control unit.

The aforementioned overheat cut-off function and overcurrent control circuit function properly when the load 102 or wiring short-circuits completely, so that a large current flows. However, it does not function properly when a small short-circuit current flows because rare short-circuit like an incomplete short-circuit having some extent of short-circuit resistance occurs. Thus, there is no way but controlling so as to turn OFF the thermal FET QF by detecting the abnormal current by the microcomputer 903 via a monitor circuit for current, so that responsibility of control by microcomputer to abnormal current is worse.

Further, because the shunt resistor RS, microcomputer 903 and the like are necessary, a large installation space is needed. Thus, there is a problem that the cost for the unit is increased by these relatively expensive components.

SUMMARY OF THE INVENTION

The present invention has been accomplished to solve the above described problems and, therefore, an object of the invention is to provide a power supply control unit easy to integrate and cheap, in which the necessity of a shunt resistor RS to be connected directly to a power supply path to detect a current is eliminated so as to suppress heat generation and responding rapidly to an abnormal current which may be generated when a rare short-circuit like an incomplete short-circuit having some extent of short-circuit resistance occurs.

To achieve the above object, there is provided a power supply control unit having a first semiconductor switch for controlling power supply to a load and a control circuit for detecting an abnormal current in the first semiconductor switch and generating a vibration current by controlling ON/OFF of the first semiconductor switch when an abnormal current occurs so as to shut off the first semiconductor switch by the vibration current, the control circuit comprising: a second semiconductor switch which is connected in parallel to the first semiconductor switch, for controlling power supply to a first reference load indicating a reference value which may reach a maximum value in normal current operating range of the first semiconductor switch; a first comparative means for comparing a voltage on a first terminal of the first semiconductor switch with a voltage on a second terminal of the second semiconductor switch; and a control voltage supply means for supplying a control voltage to the control terminals of the first and second semiconductor switches according to an output from the first comparative means.

According to a preferred embodiment of the present invention, the above-mentioned power supply control unit further comprises a third semiconductor switch which is connected in parallel to the first semiconductor switch, for controlling a power supply to a second reference load indicating a minimum value in normal current operating range of the load; and a second comparative means for comparing the voltage on the first terminal of the first semiconductor switch with a voltage on a third terminal of the third semiconductor switch.

According to a preferred embodiment of the present invention, the above-mentioned power supply control unit further comprises a notifying means for, when the voltage on the first terminal is larger than the voltage on the third terminal according to an output from the second comparative means, notifying that the load is smaller than a minimum application current.

Further, to achieve the above object, there is provided a power supply control method using a power supply control unit comprising: a first semiconductor switch for controlling a power supply to a load; and a second semiconductor switch which is connected in parallel to the first semiconductor switch, for controlling power supply to a first reference load indicating a reference value which may reach a maximum value in normal current operating range of the first semiconductor switch, the power supply control method having a control step for detecting an abnormal current in the first semiconductor switch and generating a vibration current by controlling ON/OFF of the first semiconductor switch when the abnormal current occurs so as to shut off the first semiconductor switch by the vibration current, the control step including: a first comparative step for comparing a voltage on the first terminal of the first semiconductor switch with a voltage on a second terminal of the second semiconductor switch; and a control voltage supply step for supplying a control voltage to control terminals of the first and second semiconductor switches according to an output from the first comparative step.

According to a preferred embodiment of the present invention, the above-mentioned power supply control method, with using the power supply control unit further comprising a third semiconductor switch which is connected in parallel to the first semiconductor switch, for controlling a power supply to a second reference load indicating a minimum value in normal current operating range of the load, further comprises a second comparative step for comparing the voltage on the first terminal of the first semiconductor switch with a voltage on a third terminal of the third semiconductor switch.

According to a preferred embodiment of the present invention, the above-mentioned power supply control method further comprises a notifying step for, when the voltage on the first terminal is larger than the voltage on the third terminal according to an output from the second comparative means, notifying that the load is smaller than a minimum application current.

The nature, principle and utility of the invention will become more apparent from the following detailed description when read in conjunction with the accompanying drawings.

BRIEF DESCRIPTION OF THE DRAWINGS

In the accompanying drawings

DESCRIPTION OF THE PREFERRED EMBODIMENTS

Hereinafter, the preferred embodiments of the power supply control unit and power supply control method according to the present invention will be described in detail with reference to FIGS. 2 to 7. Although, in the following description, the power supply control unit and power supply control method will be described about an embodiment in which the present invention is applied to a power supply control unit which supplies an electric power to a load like a fuel gauge provided in a fuel tank of automobile and controls the power supply to the load, the present invention is not restricted to any particular embodiment, however, the present invention is applicable to any power supply control unit or power supply control method for controlling a power supply from the power source to the load by switching operation.

Figure 1:
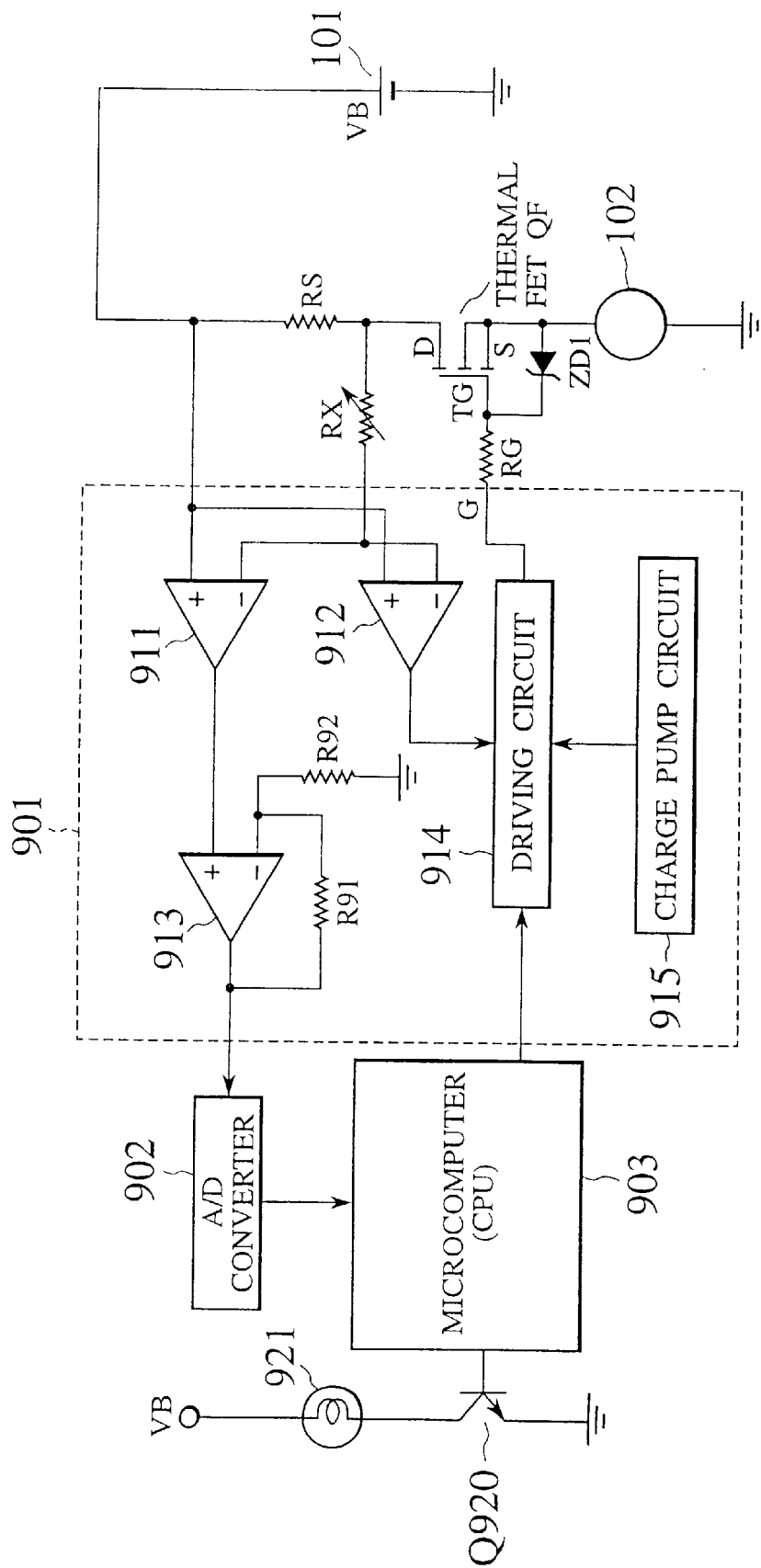
FIG. 1 is a circuit configuration diagram of a conventional power supply control unit having a semiconductor switch.
Figure 2:
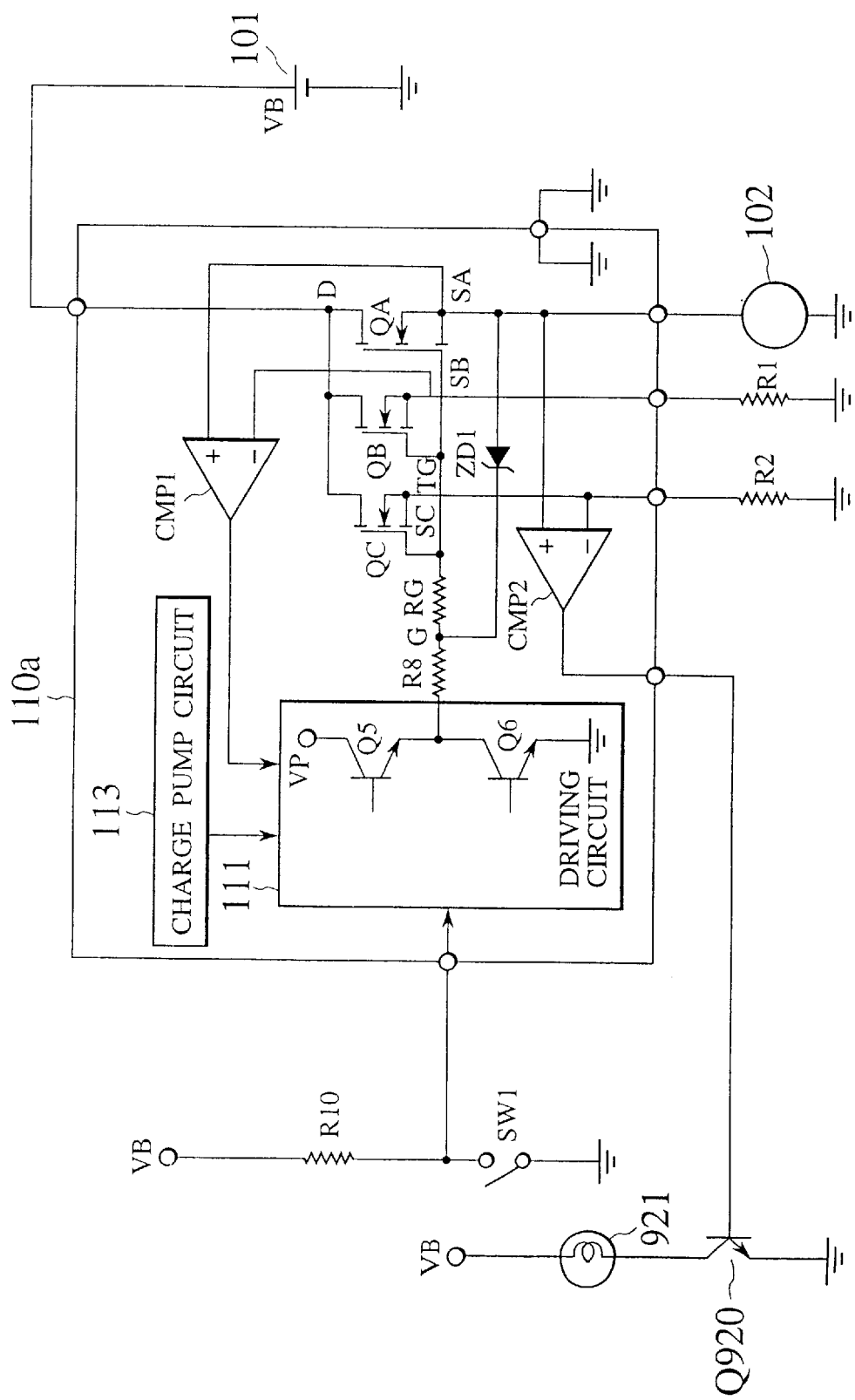
FIG. 2 is a circuit configuration diagram of a power supply control unit according to an embodiment of the present invention.

According to an embodiment of the present invention, as shown in FIG. 2, the power supply control unit is so constructed that drain D and source SA of a temperature sensor incorporated FET are connected in series in a path for supplying an output voltage VB of the power source 101 to a load 102 which is a fuel gauge. Although the temperature sensor incorporated FET QA here is of NMOS type having DMOS structure, this can be achieved with PMOS type also.

In the same Figure, a portion for controlling the driving of the temperature sensor incorporated FET QA includes reference FET QB to FET QC, resistors R1, R2, RG, R8, R10, Zener diode ZD1, comparator CMP1, CMP2, driving circuit 111, charge pump circuit 113 and switch SW1. Although "R" and numeral or character following it are used for a resistor as reference numeral, not only they are used as the reference numeral but also indicate a resistance of that resistor. A portion indicated by reference numeral 110a surrounded by dot line of FIG. 2 indicates a chip portion to be analog-integrated.

Reference numeral 102 denotes a fuel gauge composed of a variable resistor for detecting a remainder of fuel in the fuel tank, which is actuated when user turns ON the switch SW1. A driving circuit 111 is so constructed that a source transistor Q5 whose collector side is connected to potential VP and a sync transistor Q6 whose emitter side is connected to grounding potential (GND) are connected in series. Base on a selection signal produced by turning ON/OFF the switch SW1, the source transistor Q5 and sync transistor Q6 are turned ON/OFF so as to output a signal for controlling the driving of the temperature sensor incorporated FET QA. In the same Figure, symbol VB denotes an output voltage of the power source 101, which is, for example, 12 V. Symbol VP denotes an output voltage of a charge pump circuit 113, which is, for example, VB+10 V.

Figure 3:
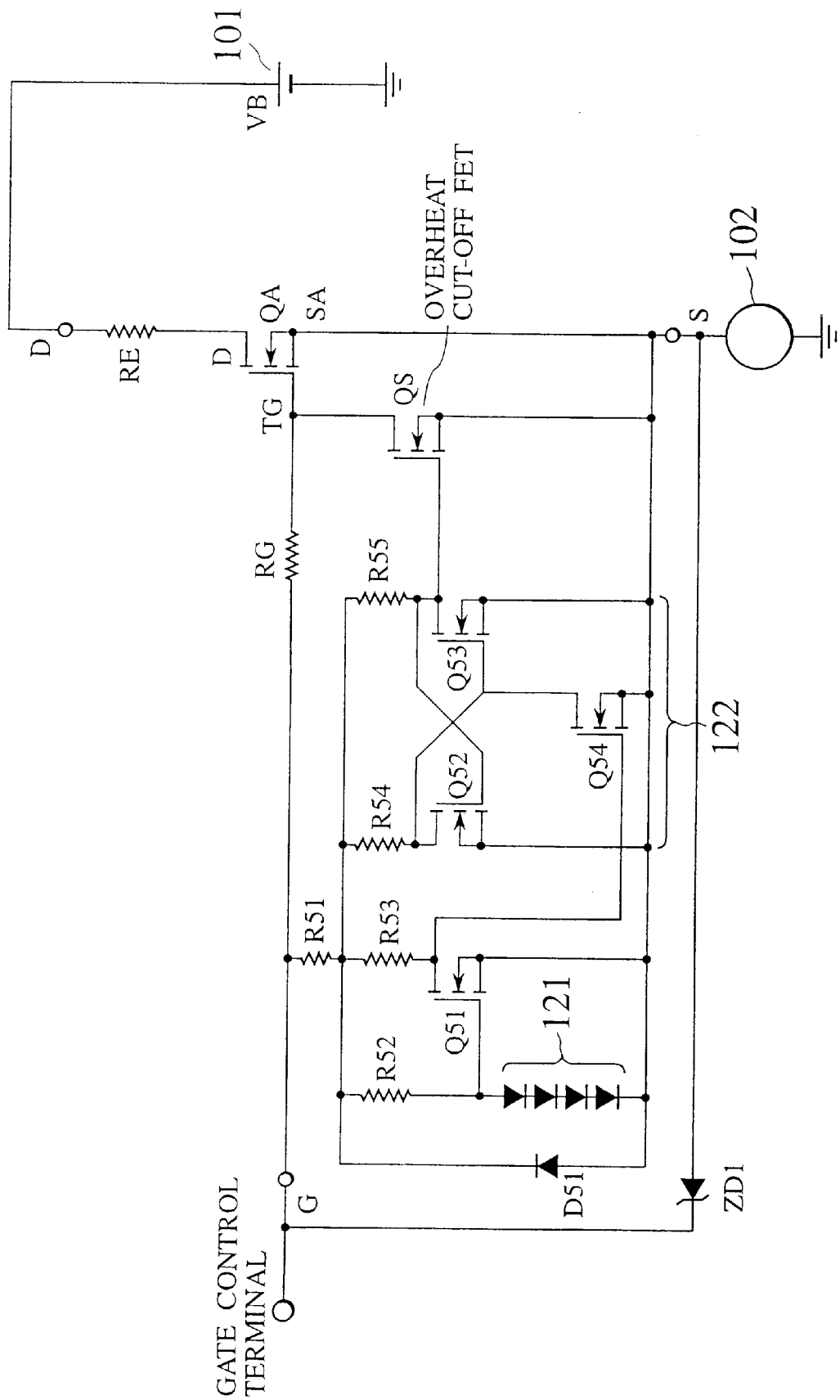
FIG. 3 is a detailed circuit configuration diagram of a semiconductor switch (temperature sensor incorporated FET) for use in the embodiment.

The temperature sensor incorporated FET QA as a semiconductor switch has a structure shown in FIG. 3. Referring to FIG. 3, the temperature sensor incorporated FET QA comprises an incorporated resistor RG, a temperature sensor 121, a latch circuit 122 and an overheat cut-off FET QS. ZD1 denotes a Zener diode which maintains 12 V between gate G and source SA and bypasses when an overvoltage is about to be applied to the gate G.

When it is detected that the temperature of the temperature sensor incorporated FET QA rises to a temperature over a predetermined value by the temperature sensor 121, detection information about that is held by the latch circuit 122 and the overheat cut-off FET QS as a gate cut-off circuit is turned ON so as to turn OFF the temperature sensor incorporated FET QA.

The temperature sensor 121 is constructed by connecting four diodes vertically. As the temperature of the temperature sensor incorporated FET QA rises, a resistance of each diode of the temperature sensor 121 decreases. Thus, when gate potential of FET Q51 drops to potential of "L" level, the FET Q51 turns from ON state to OFF state. As a result, the gate potential of the FET Q54 is pulled up to a potential of a gate control terminal (G) of the temperature sensor incorporated FET QA so that the FET Q54 turns from OFF state to ON state. As a result, "1" is latched by the latch circuit 122. At this time, the output of the latch circuit 122 becomes "H" level so that the overheat cut-off FET QS turns from OFF state to ON state. Thus, a real gate (TG) of the temperature sensor incorporated FET QA and source (SA) of the temperature sensor incorporated FET QA become the same potential, so that the temperature sensor incorporated FET QA turns from ON state to OFF state thereby cutting off overheat.

Further, the power supply control unit of this embodiment also has a protective function for an overcurrent due to a short-circuit fault which may occur in the load 102 or between the source (SA) of the temperature sensor incorporated FET QA and load 102 or abnormal current due to incomplete short-circuit fault. Hereinafter, a structure for achieving this protective function will be described with reference to FIG. 2.

First, drain and gate of reference FET QB, FET QC are connected to drain (D) and real gate (TG) of the temperature sensor incorporated FET QA and source (SB) of the reference FET QB is connected to a terminal of resistor R1 while the other terminal of the resistor R1 is connected to grounding potential (GND). Source (SB) of the FET QC is connected to a terminal of the resistor R2 while the other terminal of the resistor R2 is connected to grounding potential (GND). By making common the drain (D) and gate (TG) of the reference FET QB, FET QC and temperature sensor incorporated FET QA, integration to a switching device (110a) having current vibration type cut-off function, composed of the same chip can be facilitated.

The reference FET QB, FET QC and temperature sensor incorporated FET QA are formed on the same chip (110a) by the same process. Because detection of current according to this embodiment is carried out by detecting a difference between the source voltage $V_{SA}$ of the temperature sensor incorporated FET QA and reference voltage by means of a comparator CMP1, it is possible to remove (delete) an in-phase error cause in current detection, namely, an influence of power source voltage, temperature drift or deviation between lots by forming the reference FET QB and temperature sensor incorporated FET QA on the same chip. Further, because the resistor R1 is installed outside of the chip 110a, a possibility of an influence upon the reference voltage of a temperature change of the chip 110a drops, so that a high precision current detection can be carried out.

Further, to make current capacities of the reference FET QB and FET QC smaller than the current capacity of the temperature sensor incorporated FET QA, transistors connected in parallel for composing the respective FETs are so constructed that a ratio of the numbers thereof is (number of the transistors of the reference FET QB, FET QC: 1)< (number of transistors of the temperature sensor incorporated FET QA: 1000).

The comparator CMP1 forms part of a first comparative means, which is called in claims. A source voltage $V_{SA}$ of the temperature sensor incorporated FET QA is supplied to "+" input terminal of the comparator CMP1 and a source voltage $V_{SB}$ of the reference FET QB is supplied "−" to input terminal thereof. When potential supplied to the "+" input terminal is larger than potential supplied to the "−" input terminal, the output is made valid ("H" level). When potential supplied to the "+" input terminal is smaller than potential supplied to the "−" input terminal, the output is made invalid ("L" level).

Further, the comparator CMP2 forms part of a second comparative means, which is called in claims. A source voltage $V_{SA}$ of the temperature sensor incorporated FET QA is supplied to "+" input terminal of the comparator CMP2 while a source voltage $V_{SC}$ of the reference FET QB is supplied to "−" input terminal. That is, when potential supplied to the "+" input terminal is larger than potential supplied to the "−" input terminal, the output is made valid ("H" level) and when potential supplied to the "+" input terminal is smaller than potential supplied to the "−" input terminal, the output is made invalid ("L" level).

Figure 4:
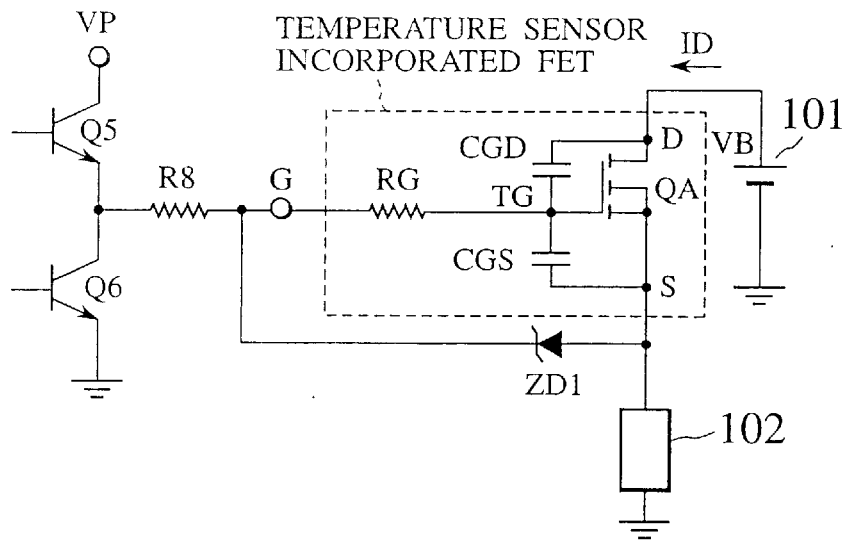
FIG. 4 is an explanatory diagram (No.1) for explaining a principle for use in the power supply control unit and power supply control method of the embodiment, indicating a rise-up characteristic of a voltage between drain and source at the time of transition from OFF state to ON state.

Next, the power supply control method will be described based on a circuit structure of the power supply control unit of this embodiment. Prior to concrete description of operation, a principle used by the power supply control unit and power supply control method of this embodiment will be described with reference to FIGS. 4, 5 and 6. FIG. 4 is an explanatory diagram of fall characteristic of voltage between drain and source at the time of transition from OFF state to ON state, FIG. 5 is a conceptual circuit diagram and FIG. 6 is an explanatory diagram for explaining the characteristics of drain current and voltage between date and source in the temperature sensor incorporated FET.

Figure 5:
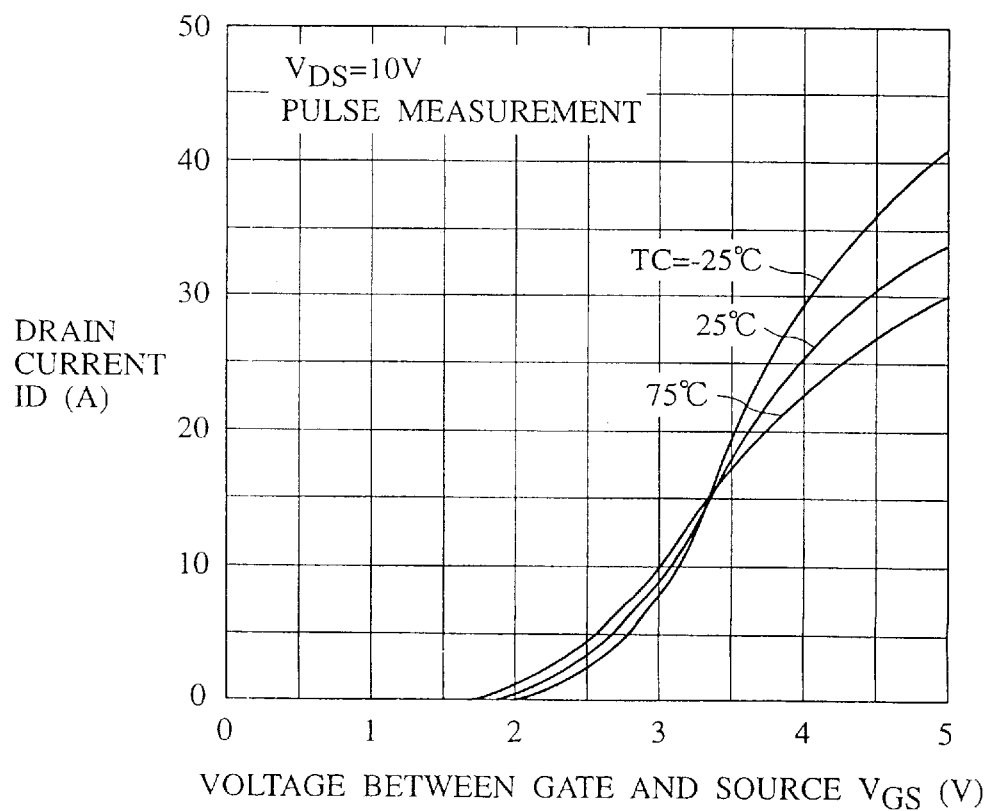
FIG. 5 is an explanatory diagram (No.2) for explaining a principle for use in the power supply control unit and power supply control method of the embodiment or a conceptual circuit diagram.
Figure 6:
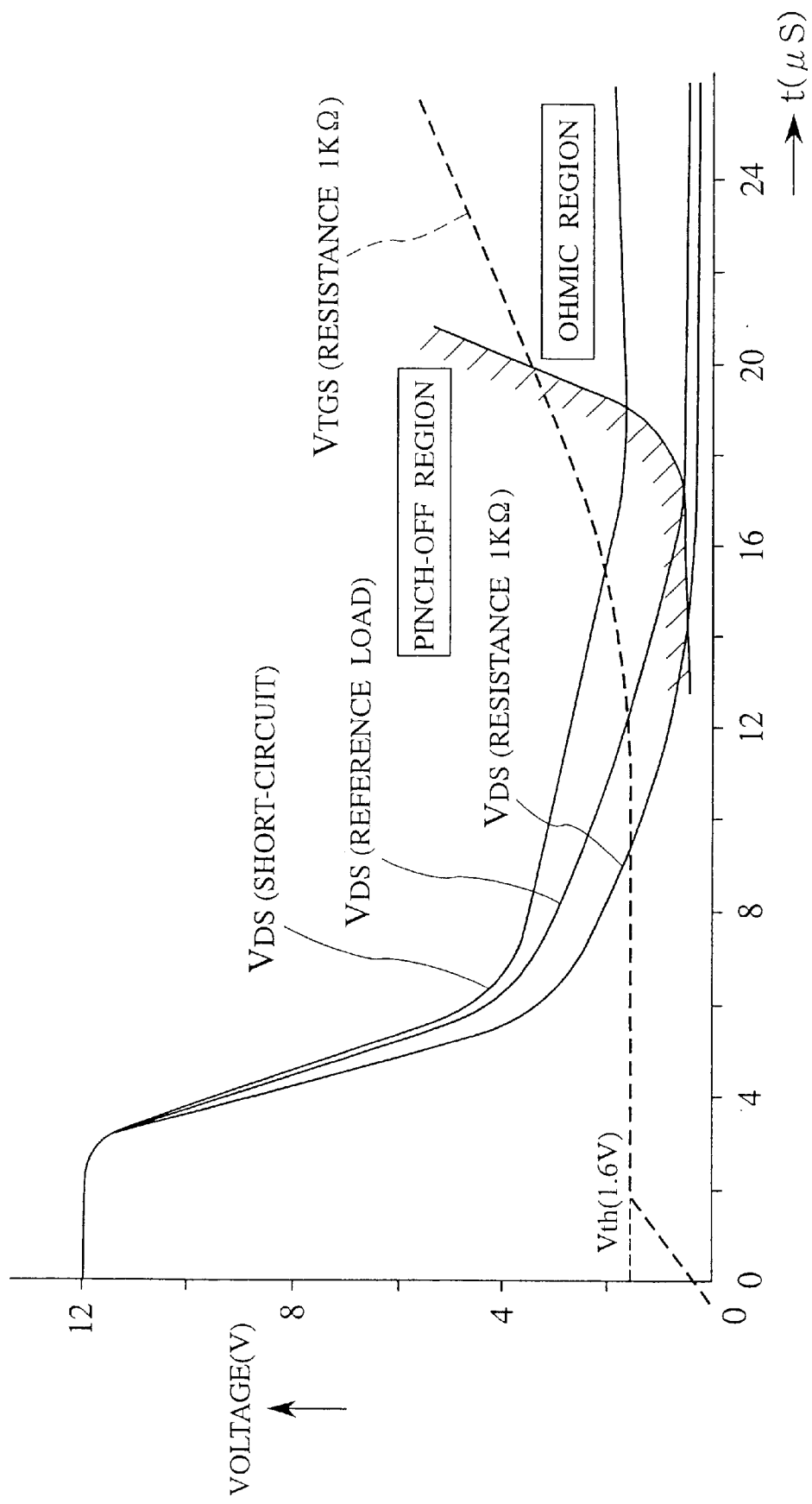
FIG. 6 is an explanatory diagram (No.3) for explaining a principle for use in the power supply control unit and power supply control method of the embodiment or an explanatory diagram for explaining characteristics of a drain current in the temperature sensor incorporated FET and a voltage between drain and source.

When the temperature sensor incorporated FET QA is used as a semiconductor switch, a power supply path from the power source 101 to the load 102 is schematically represented as a circuit shown in FIG. 5. The load 102 includes wiring inductance L0 and wiring resistance R0 of power supply path. When a short-circuit fault occurs in the path or load 102, short-circuit resistance is included in the R0. Assuming that the load 102 is a fuel gauge in automobile to which this embodiment is applicable, the short-circuit resistance is below 40 mΩ in case of complete short-circuit (dead short-circuit) and about 40 to 500 mΩ in case of incomplete short-circuit.

The voltage $V_{DS}$ between drain and source of the temperature sensor incorporated FET QA which is part of such power supply path is shown in FIG. 4 as the characteristic of fall voltage when the temperature sensor incorporated FET QA turns from OFF state to ON state. That is, this is the characteristic of fall voltage when the load 102 has a resistance of 1 KΩ under short-circuit and with reference load (normal operation). The fall characteristic changes depending on the power supply path and load state, namely, wiring inductance possessed by the path and time constant based on wiring resistance and short-circuit resistance.

Although, as a method for detecting overcurrent using a change in the characteristic of voltage $V_{DS}$ between drain and source, a method for detecting overcurrent by comparing with a predetermined threshold at a predetermined timing may be considered, a capacitor, plural resistors and the like are necessary to form a means for specifying the predetermined timing and the comparing means for comparing with the predetermined threshold. Then, when the quality of these components deviates, a detection error may occur. Further, the capacitor is necessary and because the capacitor cannot be loaded on a chip, an external installation part is needed, thereby leading to increase of production cost.

Referring to FIG. 4, the temperature sensor incorporated FET QA is operated in pinch-off region until the temperature sensor incorporated FET QA is turned ON so that the voltage $V_{DS}$ between drain and source is saturated.

A change in the voltage $V_{DS}$ between drain and source when the resistance of the load 102 is 1 KΩ can be considered as follows. Namely, first, when HITACHI "HAF2002" is used as the temperature sensor incorporated FET QA, the voltage $V_{TGS}$ between gate and source is maintained substantially at a threshold voltage of 1.6 V because drain current ID is 12 mA. Second, although the voltage $V_{TGS}$ between gate and source rises because charging to the gate (G) by the driving circuit 111 is continued, the voltage $V_{DS}$ between drain and source drops so that electric charge of capacity $C_{GD}$ between gate and drain is discharged. Thus, electric charge which reaches the voltage $V_{TGS}$ between gate and drain is absorbed. That is, the voltage $V_{DS}$ between drain and source drops at such a speed that electric charge is discharged from capacity $C_{GD}$ between gate and drain such that electric charge reaching the voltage $V_{TGS}$ between gate and source generates no rise in potential. As a result, the voltage $V_{TGS}$ between gate and source is maintained at about 1.6 V. Then, as the voltage $V_{TGS}$ between gate and drain drops, the voltage $V_{DS}$ between drain and source also drops. At this time, there are two factors which absorb electric charges. A first factor is discharge (mirror capacity) of capacity $C_{GD}$ between gate and drain due to reduction of the voltage $V_{TGD}$ between gate and drain, and a second factor is an increase of the capacity $C_{GD}$ between gate and drain due to reduction of blocking layer in n region.

Further, the change in the voltage $V_{DS}$ between drain and source when the load resistance is 1 KΩ can be also interpreted as follows. That is, this indicates a value of the voltage $V_{DS}$ between drain and source for maintaining the voltage $V_{TGS}$ of a real gate (TG) by absorbing electric charge sent to the gate (G) by the driving circuit 111 at respective transition points after the temperature sensor incorporated FET QA is turned to ON state. Thus, when the voltage $V_{DS}$ between drain and source after some time passes is above a curve when the load resistance is 1 KΩ in FIG. 4, it means that the voltage $V_{TGS}$ between gate and source is higher than 1.6 V.

Further, assuming that a distance from a curve when the load resistance is 1 KΩ in FIG. 4 at the same passage time is $\Delta V_{DSGAP}$, when electric charge of $\Delta V_{DSGAP} \times C_{GD}$ is subtracted from the voltage $V_{TGS}$ between gate and source, the voltage $V_{TGS}$ between gate and source is 1.6 V. In other words, it means that the voltage $V_{TGS}$ between gate and source has risen by an amount corresponding to this electric charge from 1.6 V. When this condition is expressed, it can be expressed in a following equation.

$$V_{TGS} - 1.6 = \Delta V_{DSGAP} \times 2C_{GD}/(C_{GS} \times 2C_{GD}) \quad (1)$$

That is, $\Delta V_{DSGAP}$ is parallel to (voltage $V_{TGS}$ between gate and source −1.6 V).

There is a substantially proportional relationship of 1 to 1 between the voltage $V_{TGS}$ between gate and source and drain current ID as shown by the characteristic of FIG. 6. Here, the characteristic of FIG. 6 is that of HITACHI "HAF2001" and $V_{GS}$ in the Figure corresponds to the voltage $V_{TGS}$ between gate and source. Therefore, the $\Delta V_{DSGAP}$ is capable of expressing the drain current ID based on a corresponding relation shown in FIG. 6. In FIG. 6, resolution in the vicinity of drain current ID=10 A is about 60 mV/A. That is, a change in drain current ID of 1 A corresponds to a change in the voltage $V_{TGS}$ between gate and source of 60 mV and a change in the drain current ID of ±5 A corresponds to a change in the voltage $V_{TGS}$ between drain and source of ±0.3 V. Meanwhile, this resolution corresponds to a resolution of shunt resistor RS=60 mΩ in a conventional example.

Although when the drain current ID is zero, the curve of the voltage $V_{DS}$ between drain and source is determined by only a circuit for charging the gate and mirror capacity, when the drain current ID flows, inductance Lc of the circuit and resistance Rc of the entire circuit make influence. Although the curve of the voltage $V_{DS}$ between drain and source rises as the drain current ID increases, when the drain current ID increases like a complete short-circuit (dead short-circuit), riseup gradient of the drain current ID converges to a constant value determined by a charging speed of a circuit which charges the gate. Therefore, the curve of the voltage $V_{TGS}$ between gate and source also converges. Meanwhile, the riseup gradient of the drain current ID determined by a riseup of the curve of the voltage $V_{TGS}$ between gate and source when a change in the voltage $V_{TGD}$ between gate and drain is zero is ultimate gradient.

Next, the operation (relation of force between the voltage $V_{DS}$ between drain and source and drain current ID) of the temperature sensor incorporated FET QA when the driving circuit 111 carries out OFF control will be described in detail with reference to the conceptual circuit diagram shown in FIG. 5.

When the source transistor Q5 of the driving circuit 111 is turned to OFF state and the sync transistor Q6 is turned to ON state, electric charge accumulated in the real gate (TG) is discharged through resistors RG and R8 and sync transistor Q6.

At this time, when the temperature sensor incorporated FET QA is within ohmic region, gate electric charge is discharged and even when the voltage $V_{TGS}$ between gate and source drops, the drain current ID is hardly affected. Further, the voltage $V_{DS}$ between drain and source is hardly changed neither.

When the temperature sensor incorporated FET QA enters the pinch-off region, discharge of gate electric charge lowers the voltage $V_{TGS}$ between gate and source, intending to reduce the drain current ID. However, because the drain current ID intends to continue its operation according to a condition determined by an outside circuit, the voltage $V_{DS}$ between drain and source increases so that the capacity $C_{GD}$ between gate and drain is charged and consequently, the discharged electric charge amount of the gate is canceled to eliminate an influence upon the drain current ID. Such cover operation is continued in a range in which the voltage $V_{DS}$ between drain and source can change. This phenomenon is caused due to relation in magnitude between a force for changing the drain current ID and a force for changing the voltage $V_{DS}$ between drain and source and occurs when the force for changing the voltage $V_{DS}$ between drain and source is much weaker than the force for changing the drain current ID.

Even when the driving circuit 111 conducts OFF control in a process in which the drain current ID increases, the drain current ID is covered by a change in the voltage $V_{DS}$ between drain and source while the voltage $V_{DS}$ between drain and source can change (increase), so that the drain current ID continues to increase. When the voltage $V_{DS}$ between drain and source is disabled to increase, the drain current ID decreases according to potential (voltage $V_{TGS}$ between gate and source) determined by only discharge of gate electric charge. That is, even when the driving circuit 111 conducts OFF control, the drain current ID is hardly affected until the change in the voltage $V_{DS}$ between drain and source ends. That mechanism is a source for ON/OFF operation of the temperature sensor incorporated FET QA.

Finally, when the circuit for charging the gate is different, the curve of the voltage $V_{DS}$ between drain and source against the same load current changes. Thus, the gate charging current always needs to be maintained in the same condition. When the gate charging current is decreased, the curve of the voltage $V_{DS}$ between drain and source is shifted upward. When the voltage $V_{DS}$ between drain and source is increased with respect to the same drain current ID using this character, the overheat cut-off by the overheat cut-off protective function can be accelerated. The overheat cut-off acceleration circuit which will be described later uses this phenomenon.

Next, the operation of the power supply control unit of this embodiment will be described based on the above consideration. First, temperature sensor incorporated FET QA and generation of the reference voltage (reference FET QB, resistor R1) will be described. The temperature sensor incorporated FET QA and reference FET QB forms a current mirror circuit of 1000:1. When the source potentials of both are equal, it comes that the drain current $ID_{QA}$ is 1000×drain current $ID_{QB}$ . . . (2).

Therefore, when the drain current $ID_{QA}$ of 5 A in the temperature sensor incorporated FET QA and drain current $ID_{QB}$ in the reference FET QB flow, the voltage $V_{DS}$ between drain and source coincides with the voltage $V_{TGS}$ between gate and source in each of the temperature sensor incorporated FET QA and reference FET QB. That is, $V_{DSA}=V_{DSB}$ and $V_{TGSA}=V_{TGSB}$ . . . (3).

Here, $V_{DSA}$ and $V_{DSB}$ are voltages between drain and source of the temperature sensor incorporated FET QA and reference FET QB respectively, and $V_{TGSA}$ and $V_{TGSB}$ are voltages between gate and source of the temperature sensor incorporated FET QA and reference FET QB respectively.

Therefore, because a substantial power voltage VB is applied to both ends of the resistor R1 when the reference FET QB is completely turned to ON state, the resistance of the resistor R1 is determined as R1=12 V/5 mA=1.4 KΩ . . . (4), as a load of the reference FET QB equivalent to the load of 5 A connected to the temperature sensor incorporated FET QA.

As described above, although a value (curve) of the voltage $V_{DS}$ between drain and source when the load current of 5 A flows in the temperature sensor incorporated FET QA is used as reference value, by generating the reference voltage using a reference FET QB having a smaller transistor quantity ratio (=current capacity ratio) than the temperature sensor incorporated FET QA, a circuit structure for generating the reference voltage is further reduced in size thereby achieving a requested function with such small occupied area. Further, by forming the reference FET QB and temperature sensor incorporated FET QA on the same chip in the same process, a deviation between lots and an influence of temperature drift can be eliminated so as to improve detection accuracy largely.

Next, the operation of the pinch-off region will be described. When the temperature sensor incorporated FET QA is changed from OFF state to ON state, the drain current $ID_{QA}$ rises aiming at a final load current determined by the circuit resistance. Further, the voltage $V_{TGSA}$ between gate and source of the temperature sensor incorporated FET QA becomes a value determined by the drain current $ID_{QA}$ and also rises while being braked by a mirror effect of the capacitor $C_{GD}$ due to a reduction of the voltage $V_{DSA}$ between drain and source. Further, the voltage $V_{TGSB}$ between gate and source of the reference FET QB is determined by an operation of the reference FET QB as a source follower with resistance R=1.4 KΩ as a load.

Further, because the voltage $V_{TGSA}$ between gate and source of the temperature sensor incorporated FET QA increases with an increase of the drain current $ID_{QA}$, the voltage between gate and source becomes $V_{TGSB}<V_{TGSA}$.

Because of relations of $V_{DSA}=V_{TGSA}+V_{TGD}$, $V_{DSB}=V_{TGSB}+V_{TGD}$ . . . (5)
it comes that $V_{DSA}-V_{DSB}=V_{TGSA}-V_{TGSB}$ . . . (6)

Here, because a differential $V_{TGSA}-V_{TGSB}$ of voltage between gate and source expresses drain current $ID_{QA}-ID_{QB}$, by detecting the $V_{TGSA}-V_{TGSB}$, $ID_{QA}$ and the current $ID_{QB}$ flowing through the reference voltage generating means approach 5 mA corresponding to $ID_{QA}$=5 A as the $V_{DSB}$ decreases gradually (at this time, $V_{DSA}$ also decreases).

The voltage $V_{DSB}$ between drain and source of the reference FET QB is inputted directly into the comparator CMP1 and the voltage $V_{DSA}$ between drain and source is inputted directly into the comparator CMP1. Although just after the temperature sensor incorporated FET QA is turned to ON state, there is a relation of voltage $V_{DSB}$ between drain and source of the reference FET QB>voltage $V_{DSA}$ between drain and source of the temperature sensor incorporated FET QA, the voltage $V_{DSA}$ between drain and source of the temperature sensor incorporated FET QA increases with an increase of the drain current $ID_{QA}$ of the temperature sensor incorporated FET QA and finally becomes larger than the voltage $V_{DSB}$ between drain and source of the reference FET QB. At this time, the output of the comparator CMP1 changes from "H" level to "L" level so that the temperature sensor incorporated FET QA is turned to OFF state.

Assuming that the voltage $V_{DSA}$ between drain and source when the temperature sensor incorporated FET QA is turned to OFF state is threshold $V_{DSAth}$, a following equation is established.

$$V_{DSAth}-V_{DSA}=V_{DSB}(\text{at 5 mA}) \qquad (7)$$

Thus, an overcurrent determination value is determined according to equation (7).

Next, an operation in the ohmic region will be described. When the temperature sensor incorporated FET QA is turned to ON state with wiring in normal condition, the voltage $V_{TGS}$ between gate and source, $V_{TGSB}$ arrive near 10 V because the temperature sensor incorporated FET QA keeps its ON state, so that the temperature sensor incorporated FET QA and reference FET QB operates in the ohmic region.

In this ohmic region, this 1-to-1 relation vanishes between the voltage $V_{GS}$ between gate and source and the drain current ID. In case of HITACHI "HAF2001", when the voltage $V_{GS}$ between gate and source is 10 V, ON resistance $R_{DS}$ (ON) is 30 mΩ. Thus, a following equation is established.

$$V_{DSB} = 5 A \times 30 \, m\Omega = 0.15 \, V$$

$$V_{DSA} = ID_{QA} \times 30 \, m\Omega$$

$$V_{DSA} - V_{DSB} = 30 \, m\Omega \times (ID_{QA} - 5 \, A) \tag{8}$$

When the drain current $ID_{QA}$ increases due to short-circuit or the like of wiring, a value of the equation (8) increases and when it exceeds an overcurrent determination value, the temperature sensor incorporated FET QA is turned to OFF state. After that, it is turned to the aforementioned pinch-off region. The temperature sensor incorporated FET QA repeats transition of ON state/OFF state and finally, reaches overheat cut-off. When the wiring is restored to normal condition before the overheat cut-off is reached (example of intermittent short-circuit fault), the temperature sensor incorporated FET QA maintains the ON state continuously and returns to the operation in the ohmic region.

Figure 7:
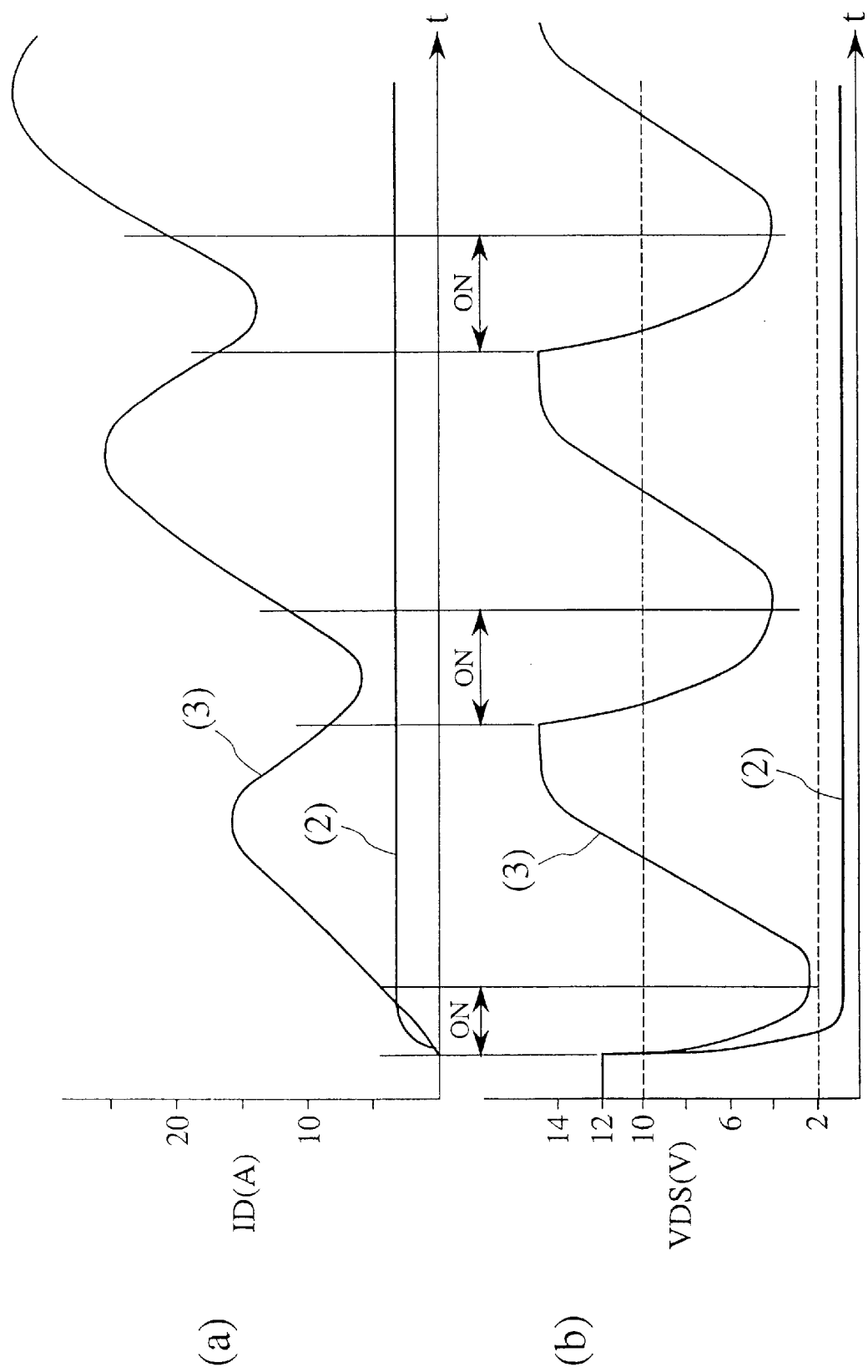
FIG. 7 is a waveform diagram for representing a current (a) and a voltage (b) in the semiconductor switch in the power supply control unit according to the embodiment at the times of a trouble due to short-circuit and normal operation.

FIG. 7 shows a waveform diagram of current and voltage in the temperature sensor incorporated FET QA in the power supply control unit of this embodiment.

FIG. 7(a) indicates drain current ID (A) and FIG. 7(b) indicates voltage $V_{DS}$ between drain and source. In the same Figure, (2) indicates a case of normal operation and (3) indicates a case of overload (including wiring short-circuit resistance between source and load).

In case of overload ((3) in the Figure), the temperature sensor incorporated FET QA repeats ON/OFF control as described above so as to activate overheat cut-off protective function by frequent heat generation of the temperature sensor incorporated FET QA.

Next, an operation of the comparator CMP2 in the ohmic region will be described.

The voltage $V_{DSC}$ between drain and source of the reference FET QC is inputted directly into the comparator CMP2 and the voltage $V_{DSA}$ between drain and source of the temperature sensor incorporated FET QA is also inputted directly into the comparator CMP2. Just after the temperature sensor incorporated FET QA is turned from OFF state to ON state, there is a relation of voltage $V_{DSC}$ between drain and source of the FET QC>voltage $V_{DSA}$ between drain and source of the temperature sensor incorporated FET QA. However, when the resistance of the load 102 increases so that the drain current $ID_{QA}$ of the temperature sensor incorporated FET QA increases, the voltage $V_{DSA}$ between drain and source of the temperature sensor incorporated FET QA also increases and finally, becomes larger than the voltage $V_{DSC}$ between drain and source of the reference FET QC. At this time, the output of the comparator CMP2 changes from "L" level to "H" level.

A relation between the load 102 and resistors R1, R2 connected to each source terminal of the temperature sensor incorporated FET QA, reference FET QB, and FET QC will be described.

The load 102 is a fuel gauge having variable resistor VR provided in the fuel tank. This resistor indicates a very small resistance when it is full and indicates a large resistance when it is empty. Then, assuming that resistance R1 is a value corresponding to a variable resistance of full condition and resistance R2 is a value corresponding to empty condition, there is a relation of R1<R2.

Meanwhile, it is permissible to use the resistance R1 as the first reference load indicating a maximum value in the normal operation range of the temperature sensor incorporated FET QA. Further, it is permissible to use the resistance R2 as the second reference load indicating a minimum value in the normal current operation range of the fuel gauge which is the load 102.

Thus, in a process in which fuel in the fuel tank decreases gradually from full condition, the source voltage $V_{DSA}$ of the temperature sensor incorporated FET QA increases gradually and finally becomes larger than the source voltage $V_{DSB}$ of the reference FET QB. As a result, the output of the comparator CMP1 changes from "L" level to "H" level. When the output of the comparator CMP1 is at "L" level, the temperature sensor incorporated FET QA is shut off by OFF control, so that the overcurrent protective function is actuated to the temperature sensor incorporated FET QA and fuel gauge which is the load 102.

Further, in a process in which remainder of fuel gradually decreases from its low level condition to the empty condition, the source voltage $V_{DSA}$ of the temperature sensor incorporated FET QA further rises so that it becomes larger than the source voltage $V_{DSC}$ of the reference FET QC. Thus, the output of the comparator CMP2 changes from "L" level to "H" level. As a result, base voltage of the transistor Q920 changes from "L" level to "H" level so as to turn ON between collector and emitter. The power VB is supplied to the lamp 921 so that it is lit notifying an operator that fuel in the fuel tank is reduced to the empty condition.

As described above, the power supply control unit and power supply control method of this embodiment do not require a conventional shunt resistor connected directly to a power supply path for detecting current and are capable of detecting an overcurrent at a high precision without using the shunt resistor. As a result, heat loss in the entire unit can be suppressed. Not only an overcurrent due to complete short-circuit but also an abnormal current caused when such a rare short-circuit as incomplete short-circuit having some extent of short-circuit resistance can be detected continuously by a hardware circuit.

In case of incomplete short-circuit, the shut-off (OFF control) of the temperature sensor incorporated FET QA by the overheat protective function can be accelerated by cyclic heat generation of the semiconductor switch by repeating ON/OFF control of the temperature sensor incorporated FET QA so as to change current largely. Further, because the ON/OFF control of the semiconductor switch can be carried out by only the hardware circuit without using any microcomputer, the installation space of the power supply control unit can be reduced so as to reduce production cost of the unit largely.

When this embodiment is compared to the other method for detecting an overcurrent by comparing it with a predetermined threshold at a predetermined timing although a change in the characteristic of the voltage $V_{DS}$ between drain and source is used like this embodiment, such components as capacitor and plural resistors are not necessary. Thus, detection error due to deviation of the quality of such components can be eliminated, and because an outside capacitor for a switching device (chip 110a) having current vibration type shut-off function is not necessary, the installation space and cost for the unit can be reduced further.

The present invention can be applied to other semiconductor switching devices than the FET. As the semiconductor switch QA, power MOSTET having, for example, DMOS structure, VMOS structure or UMOS structure or MOS electrostatic induction type transistor (SIT) having equivalent structure can be used.

It should be understood that many modifications and adaptations of the invention will become apparent to those skilled in the art and it is intended to encompass such obvious modifications and changes in the scope of the claims appended hereto.

What is claimed is:

1. A power supply control unit having a first semiconductor switch for controlling power supply to a load and a control circuit for detecting an abnormal current in said first semiconductor switch and generating a vibration current by controlling ON/OFF of said first semiconductor switch when an abnormal current occurs so as to shut off said first semiconductor switch by the vibration current, said control circuit comprising:
   a second semiconductor switch which is connected in parallel to said first semiconductor switch, for controlling power supply to a first reference load indicating a reference value which may reach a maximum value in normal current operating range of said first semiconductor switch;
   a first comparative means for comparing a voltage on a first terminal of said first semiconductor switch with a voltage on a second terminal of said second semiconductor switch; and
   a control voltage supply means for supplying a control voltage to the control terminals of said first and second semiconductor switches according to an output from said first comparative means.

2. A power supply control unit according to claim 1 further comprising:
   a third semiconductor switch which is connected in parallel to said first semiconductor switch, for controlling a power supply to a second reference load indicating a minimum value in normal current operating range of said load; and
   a second comparative means for comparing the voltage on the first terminal of said first semiconductor switch with a voltage on a third terminal of said third semiconductor switch.

3. A power supply control unit according to claim 2 further comprising a notifying means for, when the voltage on the first terminal is larger than the voltage on said third terminal according to an output from said second comparative means, notifying that said load is smaller than a minimum application current.

4. A power supply control method using a power supply control unit comprising:
   a first semiconductor switch for controlling a power supply to a load; and
   a second semiconductor switch which is connected in parallel to said first semiconductor switch, for controlling power supply to a first reference load indicating a reference value which may reach a maximum value in normal current operating range of said first semiconductor switch, said power supply control method having a control step for detecting an abnormal current in said first semiconductor switch and generating a vibration current by controlling ON/OFF of said first semiconductor switch when the abnormal current occurs so as to shut off the first semiconductor switch by the vibration current, said control step including:
   a first comparative step for comparing a voltage on the first terminal of said first semiconductor switch with a voltage on a second terminal of said second semiconductor switch; and
   a control voltage supply step for supplying a control voltage to control terminals of said first and second semiconductor switches according to an output from the first comparative step.

5. A power supply control method according to claim 4 using the power supply control unit further comprising a third semiconductor switch which is connected in parallel to said first semiconductor switch, for controlling a power supply to a second reference load indicating a minimum value in normal current operating range of said load, said power supply control method further comprising a second comparative step for comparing the voltage on the first terminal of said first semiconductor switch with a voltage on a third terminal of said third semiconductor switch.

6. A power supply control method according to claim 5 further comprising a notifying step for, when the voltage on the first terminal is larger than the voltage on said third terminal according to an output from said second comparative means, notifying that said load is smaller than a minimum application current.

* * * * *